United States Patent
Kinoshita

(10) Patent No.: US 6,535,537 B1
(45) Date of Patent: Mar. 18, 2003

(54) OPTICAL AMPLIFICATION AND LIGHT EMITTING ELEMENT

(75) Inventor: Junichi Kinoshita, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 69 days.

(21) Appl. No.: 09/663,867

(22) Filed: Sep. 15, 2000

(30) Foreign Application Priority Data

Sep. 16, 1999 (JP) .......................................... 11-262680

(51) Int. Cl.[7] .................................................. H01S 5/00
(52) U.S. Cl. .......................................... 372/50; 372/96
(58) Field of Search ............................ 372/50, 75, 69, 372/96; 359/344

(56) References Cited

U.S. PATENT DOCUMENTS

| | | | | |
|---|---|---|---|---|
| 4,897,444 A | * | 1/1990 | Schimpe | 372/96 |
| 5,448,581 A | * | 9/1995 | Wu et al. | 372/45 |
| 5,648,979 A | * | 7/1997 | Mun et al. | 372/50 |
| 5,748,661 A | * | 5/1998 | Kiely et al. | 372/50 |

OTHER PUBLICATIONS

Patent application 09/295,295 now 6 330 265 U.S. patent.

* cited by examiner

*Primary Examiner*—Quyen Leung
(74) *Attorney, Agent, or Firm*—Gray Cary Ware & Freidenrich LLP

(57) ABSTRACT

A medium having the function of light emission or optical amplification induced by optical pumping is surrounded by an annular laser (ring laser) having a diffraction grating (holographic structure) of the second order or more. The output of the ring laser emits through this diffraction grating (holographic structure) and is extracted as radiation mode. This is used as pumping light to be input to the medium that is disposed in the vicinity of the center of the assembly. To stabilize the threshold of the longitudinal mode, which has a greater amount of radiation mode, a gain medium and a reflective structure could be further provided around the periphery of this ring laser. This element also plays a role of optical pumping from the sides of a VCSEL.

8 Claims, 5 Drawing Sheets

OPTICAL AMPLIFICATION AND LIGHT EMITTING ELEMENT

BACKGROUND OF THE INVENTION

The present invention relates to an optical amplification and/or light emitting element. More specifically, the present invention relates to an optical amplification and/or light emitting element such as a surface-emitting element or a surface-emitting amplifier that comprises a medium having the function of light emission or optical amplification, including lasing, and a lasing structure that surrounds that medium.

A surface-emitting element or optical amplification element in the prior art is excited by current injection directly through an active medium. A typical example is a configuration in which minority carriers are injected into a heterojunction that means a kind of a p-n junction.

Conceptual views of the basic structure of a prior-art surface-emitting element are shown in FIGS. 5A and 5B. In other words, FIG. 5 is a plan view thereof and FIG. 5B is a section taken through the vicinity of the center thereof. The element shown in the figures is a vertical cavity surface-emitting laser (VCSEL) of a structure that will be described below by way of the fabrication process thereof.

First of all, a highly reflective distributed Bragg reflector (DBR) 2 that is a multi-layer structure of quarter-wavelength-thick InAlAs layers and InP layers is grown on top of an n-type InP substrate 1. A cladding layer 3 of n-type InP and an active layer 4 are then grown thereupon. The active layer 4 could have a strained multiple-quantum well (MQW) structure consisting of alternate layers of two types of InGaAsP materials having mutually different compositions, by way of example. A cladding layer 5 of p-type InP is then grown, followed by a highly reflective DBR 6 that is a multi-layer structure of quarter-wavelength-thick InAlAs layers and InP layers.

The DBR on the upper side is then etched to form a cylindrical mesa 10. The InAlAs layers within the DBR 6 on the upper side are selectively oxidized from the sides of the cylindrical mesa 10 to convert them into selectively oxidized layers 15. These selective oxidation layers 15 function as blocking layers for constricting the current in the active layer 4. The selective oxidation layers 15 have a refractive index that is significantly less than those of the InAlAs layers and InP layers of the DBR 6, making it possible to increase the reflectivity of the top DBR 6.

Each selective oxidation layer 15 acts as an insulating body, which means that no current will flow in the active layer 4 if the selective oxidation should happen to extend throughout the entire cylindrical mesa 10. The progress of the selective oxidation must therefore be halted at an optimal distance from the side walls of the cylindrical mesa 10. If the progress of the selective oxidation layers 15 is insufficient, the reflectivity of the current constriction region will rise, which will decrease the lasing efficiency. If the progress of the selective oxidation goes too far, on the other hand, the current constriction region will be too narrow, increasing the element resistance. To start with, the passage of a current through an ultra-small active region is itself disadvantageous from the practical point of view, in that the current density is likely to increase and the temperature is likely to rise.

It is necessary to have an electrode 20 on the upper surface of the circular cylindrical mesa 10, to induce a current therein, but this electrode 20 must be transparent to ensure that light can emit therethrough. An annular electrode with a circular window for light output is also necessary.

This VCSEL of the prior art has many problems from the characteristics point of view and the manufacturing point of view. In general, any surface-emitting element that requires a current injection therethrough has, more or less, problems that are similar to those of a VCSEL.

SUMMARY OF THE INVENTION

The present invention was devised to solve the above described technical problems. In other words, an objective thereof is to provide a high-performance, optically pumped, surface-emitting type of optical amplification and/or light emitting element that can also be manufactured extremely efficiently.

In accordance with the present invention, a medium having the function of light emission or optical amplification induced by optical pumping is surrounded by an annular laser (ring laser) having a diffraction grating (holographic structure) of the second order or more. The output from the ring laser comes via this diffraction grating (holographic structure) as radiation mode. This is used for optically pumping up the medium at the center of this structure. To stabilize the longitudinal mode of the ring laser with greater radiation mode output, a gain medium and a reflective structure could be provided around the periphery of this ring laser as an additive structure. In other word, this element also plays a role of optical pumping from the sides of a VCSEL.

In other words, an optical amplification and/or light emitting element in accordance with the present invention comprises:

a medium capable of at least light emission or amplification by optical pumping; and a ring waveguide of at least one turn, formed so as to surround the medium;

wherein the waveguide comprises a holographic element for extracting at least part of the light that is guided by the waveguide and emitting towards the medium.

In this case, the holographic element could be a diffraction grating of the second order or more, by way of example.

As a further aspect of the present invention, the medium is bounded vertically by a pair of reflective mirrors that are substantially parallel to the predetermined plane surface.

As a further aspect of the present invention, the medium and the pair of reflective mirrors form a VCSEL structure.

As a further aspect of the present invention, the optical amplification and/or light emitting element is annularly provided with another gain medium alongside of the ring waveguide.

As a further aspect of the present invention, the optical amplification and/or light emitting element is annularly provided with a phase adjustment mechanism alongside the ring waveguide.

As a further aspect of the present invention, the optical amplification and/or light emitting element is annularly provided with high reflection structure on the outer side of the ring waveguide.

As a further aspect of the present invention, the waveguide comprises an active layer in which gain is produced by current injection.

As a further aspect of the present invention, the ring waveguide is a ring laser.

As a further aspect of the present invention, the medium comprises a fluorescent material and the waveguide is a ring laser operating at blue or violet or ultraviolet wavelengths.

As a further aspect of the present invention, the optical amplification and/or light emitting element is further provided with a second medium that is capable of controlling the absorption index, between the medium and the waveguide, and the strength of pumping light that is incident on the medium can be modulated.

As a further aspect of the present invention, the medium, the waveguide, and the holographic element are integrated in a monolithic structure.

The present invention makes it possible to cause efficient lasing of an ultra-small optical amplification and/or light emitting element that is capable of optical pumping. In particular, when this invention is applied to elements such as VCSELs, the current pumping is limited to the ring laser for pumping, which has a comparatively large volume, making it unnecessary for current to flow in the VCSEL. It is therefore simple to fabricate, with no worries about any trade-off between blocking by the electrode and light extraction.

Since no current flows in the VCSEL, heat generation by the VCSEL itself is suppressed. This results in significantly improved temperature characteristics and an improvement in reliability. At the same time, since no current flows through the VCSEL, it is possible to form the MQW structure that is the active layer thereof to be far thicker than in the prior art. As a result, the gain can be greatly increased.

Furthermore, the element of the present invention has a planar disposition that is designed for monolithic integration with other electrical and optical components.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1A is a schematic plan view thereof and FIG. 1B is a section taken through the vicinity of the center thereof;

FIG. 2A is a schematic plan view thereof and FIG. 2B is a section taken through the vicinity of the center thereof;

FIG. 3A is a schematic plan view thereof and FIG. 3B is a section taken through the vicinity of the center thereof;

FIG. 5A is a schematic plan view thereof and FIG. 5B is a section taken through the vicinity of the center thereof.

DETAILED DESCRIPTION OF PREFERRED EMBODIMENTS

One feature of the present invention is the way in which optical pumping of an ultra-small surface-emitting optical amplification and/or light emitting element is achieved by disposing around the periphery thereof a ring laser operating efficiently by a current flow therethrough. This configuration is unique in that it uses radiation mode from a high-order diffraction grating formed on side surfaces of an annular waveguide, as an output of this ring laser. Embodiments of the present invention are described below with reference to the accompanying figures.

First Embodiment

Figure 1A:
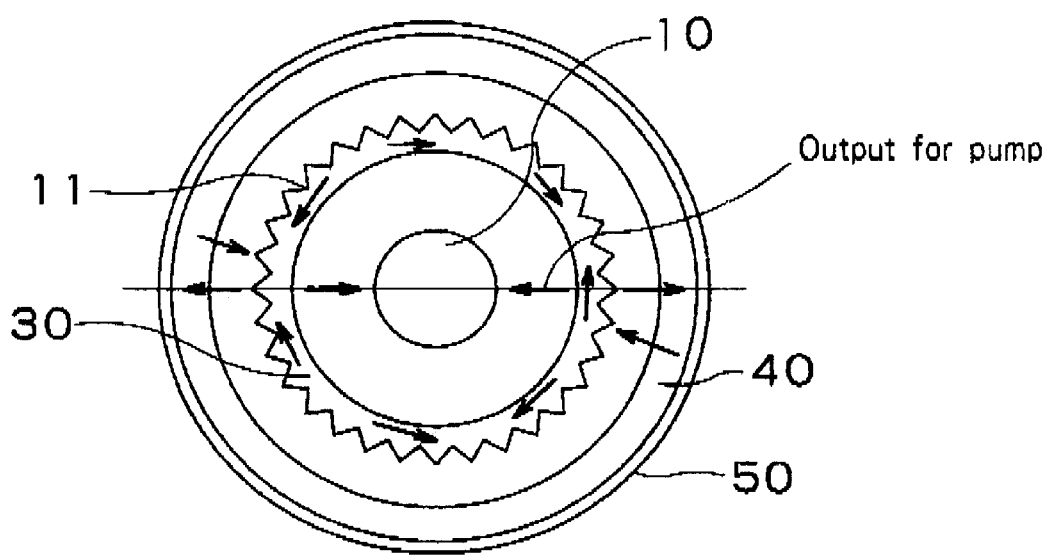
FIGS. 1A and 1B show conceptual views of an optical amplification and/or light emitting element in accordance with a first embodiment of the present invention, where
Figure 1B:
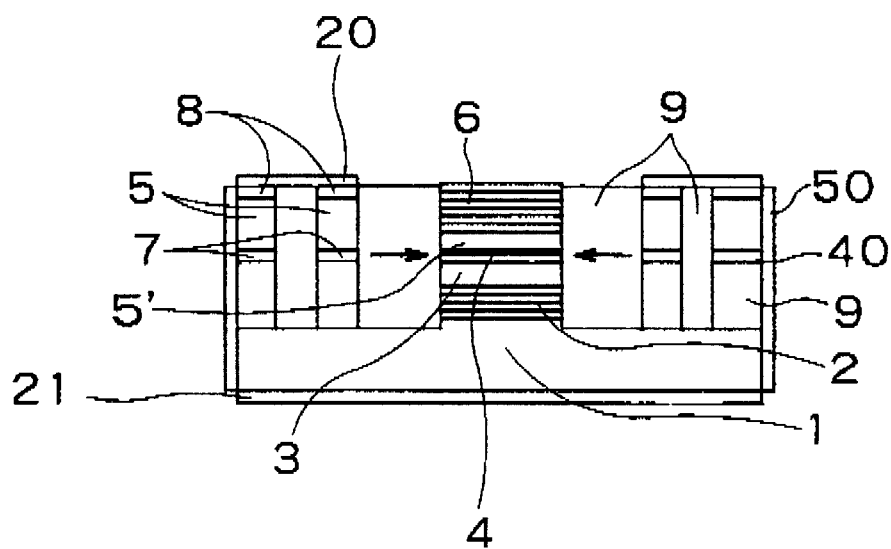

Conceptual views of an optical amplification and/or light emitting element in accordance with a first embodiment of the present invention are shown in FIGS. 1A and 1B. In other words, FIG. 1A is a schematic plan view thereof and FIG. 1B is a section taken through the vicinity of the center thereof.

An element denoted by reference number 10 in these figures is equivalent to a medium that is capable of at least light emission or amplification of the same by optical pumping. An element denoted by reference number 30 is equivalent to a waveguide of at least one turn, which is formed to surround that medium 10 on a predetermined plane surface. This waveguide 30 has a holographic element 11 that is designed to emit part of the light that is guided by the waveguide towards the medium. More specifically, the holographic element 11 can be configured of a second-order diffraction grating.

In the description herein, a VCSEL using InGaAsP and InP materials that make it easy to form a buried hereto (BH) structure is used as a specific example. The structure and fabrication process of this VCSEL are described below.

First of all, the highly reflective bottom DBR 2 is grown as a multi-layer structure formed of alternate InAlAs layers and InP layers on top of the n-type InP substrate 1.

The n-type InP cladding layer 3 is then grown, followed by the strained MQW active layer 4, which consists of alternate InGaAsP well layers and InGaAsP barrier layers having mutually different compositions.

An InGaASP barrier layer is then grown, followed by the top DBR 2 which is formed of alternate InAlAs layers and InP layers. This assembly is processed to form the circular cylindrical mesa 10 of a diameter of 5 microns. More specifically, the entire assembly is etched down as far as the lower end of the DBR 2 in one process by a method such as dry etching, then further etching with a wet etching method, which has little etching anisotropy, is done to remove any damaged layers.

Subsequently, the InAlAs layers of the DBRs 2 and 6 at the top and bottom of the mesa 10 could be selectively oxidized by a steam oxidation method to convert them into oxide layers with a low refractive index. This makes it possible to ensure that the reflectivity of the DBRs 2 and 6 is sufficiently high.

An active layer MQW 7 for a pumping ring laser, the p-type InP cladding layer 5, and a p-type InGaAs contact layer 8 are grown selectively around the periphery of the circular cylindrical mesa 10. The second-order diffraction grating (holographic element) 11 is then patterned on side surfaces of the assembly, thus forming a ring laser 30. The ring laser 30 has an annular mesa waveguide that surrounds the periphery of the circular cylindrical mesa 10.

In this state, the assembly can be used as a high-mesa type of ring laser 30 and an electrode can also be formed on the top thereof. To simplify the formation of the electrode, a groove formed by etching could be filled by a semi-insulating InP layer 9, as shown by way of example in FIGS. 1 and 1B. If the assembly is embedded in crystal in this manner, this also has the effect of mechanically strengthening the vertical resonator (mesa) 10 that has been weakened by the formation of the DBRs by selective oxidation.

In addition, an annular gain region 40 is formed on the outer side of the ring laser 30 and a highly reflective multi-layer film 50 is formed on an outer side wall thereof. The high reflection multi-layer film 50 can be formed on the side surfaces of the gain region 40 by a plasma chemical vapor deposition (CVD) method which can cover the side surfaces and recesses.

With this configuration, radiation mode emitted from the second-order diffraction grating (holographic element) 11 is amplified by the gain region 40 and is reflected back by the highly reflective multi-layer film 50, increasing the efficiency. The longitudinal mode that has a greater amount of radiation mode is amplified, the threshold value drops, and thus lasing becomes easier. In other words, a lasing stabilization effect is also obtained for the ring laser 30.

The distance between the ring laser 30 and the highly reflective multi-layer film 50 is preferably adjusted beforehand so that the phase of the radiation mode reflection returns in the most efficient manner to the ring laser. Although this is not illustrated in FIGS. 1A and 1B, it should be noted that if a mechanism for controlling the refractive index in order to control the phase of reflection of the radiation mode light waves is inserted between the ring laser 30 and the highly reflective multi-layer film 50, it will be possible to control that phase as desired.

The mesa 10 that acts as the vertical resonator for inducing light emission, lasing, or optical amplification by optical pumping can be reduced in size to a diameter on the order of 5 microns. This means that the diameter of the ring laser 30 on the outer side thereof can be reduced to 10 microns or even less. In such a case, the length of the ring laser 30 (in other words, the circumferential length thereof) becomes substantially the same as the resonator length of a 60-micron, short-resonator laser. It is therefore possible to keep the threshold currents low.

The dimensions of the ring laser 30 can be set separately from those of the vertical resonator (mesa) 10. This enables a greater flexibility of design with respect to applications and capabilities. It is possible to combine a large ring laser 30 with an ultra-small vertical resonator to enable extremely powerful optical pumping. In such a case, since no current passes through the mesa 10 that is the vertical resonator, it is possible to avoid the problem of temperature rise due to a high current density, which can occur in a conventional VCSEL.

At the same time, the lack of current flow through the VCSEL makes it possible to make the MQW structure, which is the active layer thereof, much thicker than in a conventional VCSEL. As a result, the gain can be greatly increased.

In addition, the ring laser 30 has a configuration without end facet surfaces, so there is essentially no failure mode due to end-surface deterioration. Since this element can be considered to be a surface-emitting type, there is no need for cleavage to form face mirrors and the fabrication thereof is simple.

Second Embodiment

Figure 2A:
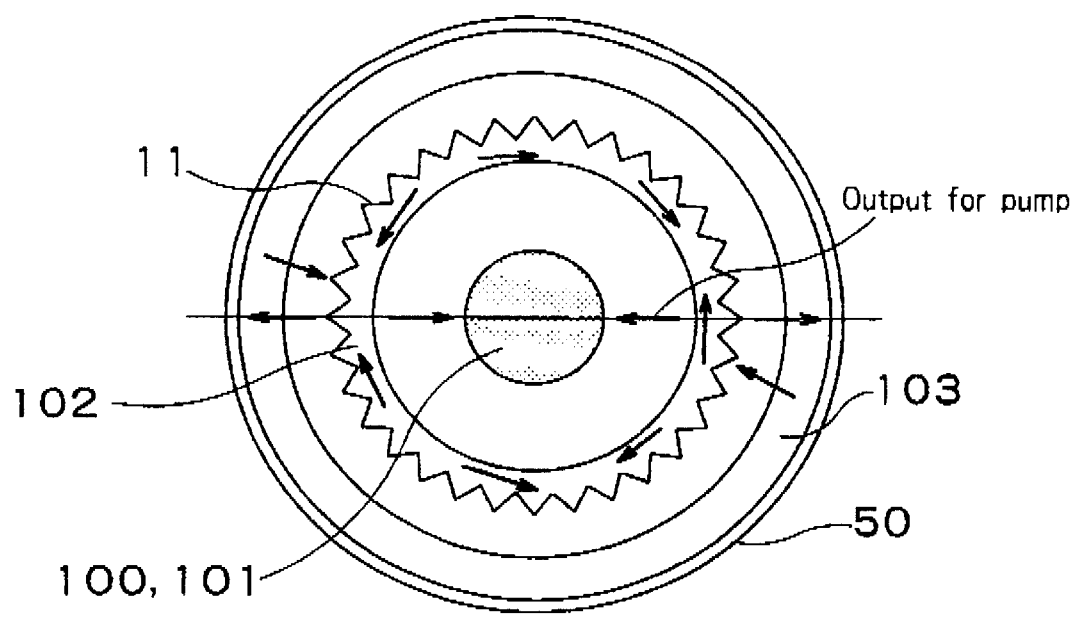
FIGS. 2A and 2B show conceptual views of an optical amplification and/or light emitting element in accordance with a second embodiment of the present invention, where
Figure 2B:
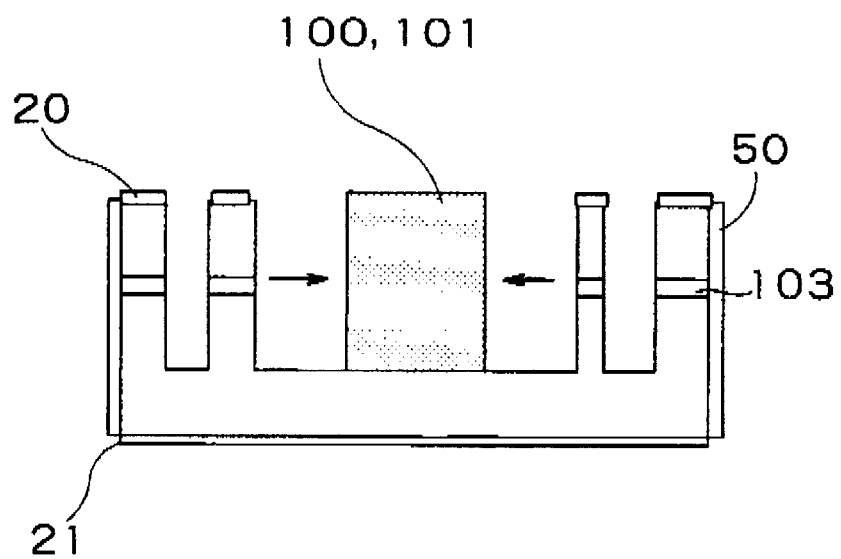

Conceptual views of an optical amplification and/or light emitting element in accordance with a second embodiment of the present invention are shown in FIGS. 2A and 2B. In other words, FIG. 2A is a schematic plan view thereof and FIG. 2B is a section taken through the vicinity of the center thereof. In FIGS. 2A and 2B, components that are the same as previously described components shown in FIGS. 1A and 1B are denoted by the same reference numbers and further description thereof is omitted.

In this embodiment, a transparent medium 101 comprising a fluorescent material 100 is placed in the center of the element instead of a vertical resonator, and a ring laser 102 operating at the wavelength that excites the fluorescent material 100 is provided therearound. A GaN laser lasing in the range from blue to ultraviolet could be used as the ring laser 102, by way of example. In addition, a gain region 103 having a gain action with respect to light emitted from the ring laser 102 is formed in a ring around the periphery thereof.

In the optical amplification and/or light emitting element exemplified in FIGS. 2A and 2B, short-wavelength pumping light that is emitted from the ring laser 102 is amplified by the gain region 103, is reflected by the highly reflective multi-layer film 50, and then is injected into the transparent medium 101 to excite the fluorescent material 100. As a result, a strong beam of second-order light can be obtained from the fluorescent material 100. This embodiment of the invention makes it possible to produce a large-aperture transparent medium 101 with embedded fluorescent material 100 that has a diameter of at least 100 microns, thus making it possible to implement a light-emitting element that has a large output and a high level of brightness.

Note that the relationship between pumping wavelength of the fluorescent material 100 and the lasing wavelength of the ring laser 102 is not necessarily limited to the region from blue to ultraviolet, and thus this embodiment of the invention can also be applied to any wavelength region such as the far ultraviolet or the region from visible light to infrared.

Third Embodiment

Figure 3A:
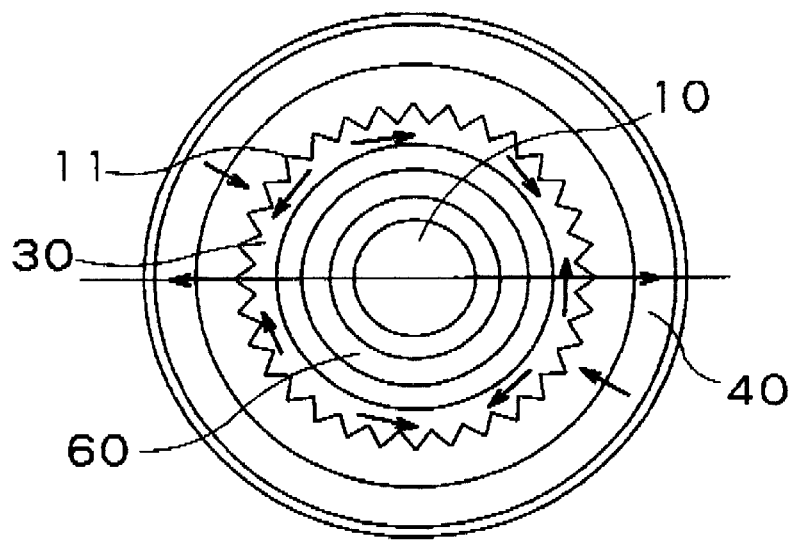
FIGS. 3A and 3B show conceptual views of an optical amplification and/or light emitting element in accordance with a third embodiment of the present invention, where
Figure 3B:
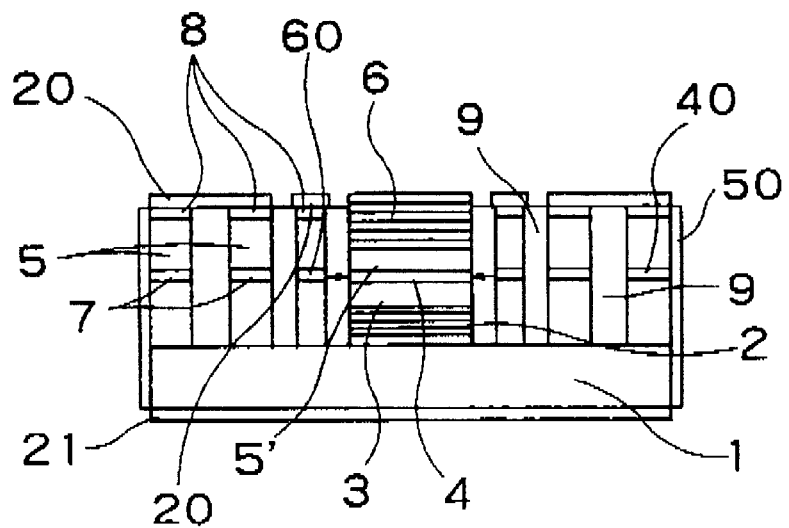

Conceptual views of an optical amplification and/or light emitting element in accordance with a first embodiment of the present invention are shown in FIGS. 3A and 3B. In other words, FIG. 3A is a schematic plan view thereof and FIG. 3B is a section taken through the vicinity of the center thereof. In the figures, components that are the same as previously described components shown in FIGS. 1A and 1B are denoted by the same reference numbers and further description thereof is omitted.

In the optical amplification and/or light emitting element of this embodiment, an element 60 that is capable of controlling the absorption index of light that is output from the ring laser 30 is placed between the ring laser 30 and the mesa 10 that acts as a vertical resonator. A specific example of such an element could be an MQW structure fabricated in InGaAsP materials having optimally designed compositions. If this MQW structure 60 is sandwiched between a p-type semiconductor layer and an n-type semiconductor layer and a reverse voltage bias is applied to the resultant p-n junctions, it will shift the absorption edge and thus act as an electro-absorption type optical modulator.

In the element exemplified in FIGS. 3A and 3B, keeping the ring laser 30 DC-operated and modulating the MQW modulator (structure) 60, ultra-high-speed modulation of the optical output from the VCSEL can be achieved.

Embodiments of the present invention have been described herein with reference to specific examples. However, the present invention is not limited to those specific examples.

For example, in each of the elements shown in FIGS. 1 to 3, the mesa 10 is disposed at the center and the ring laser 30 is disposed so as to surround the periphery thereof in a circular form. However, the shape in plan of the ring laser 30 is not necessarily limited to a circle.

Figure 4A:
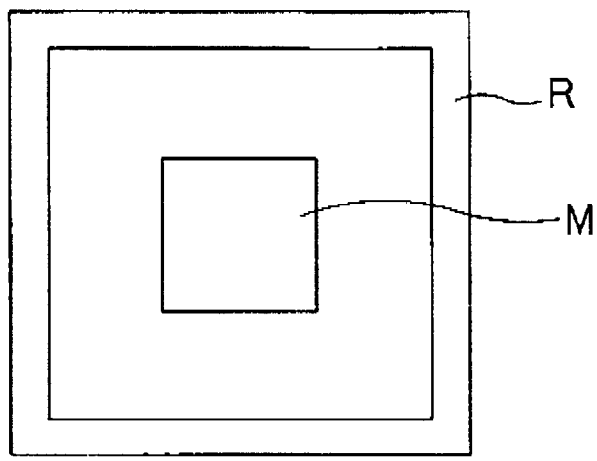
FIGS. 4A, 4B and 4C show conceptual views of examples of the planar relationship between the mesa M and the ring laser R of the present invention.
Figure 4B:
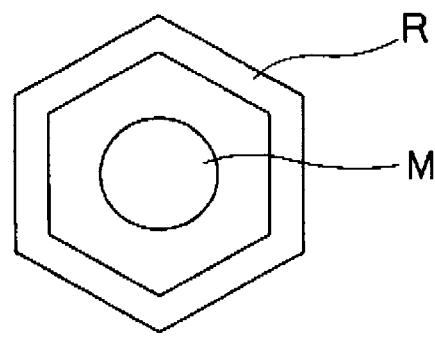
Figure 4C:
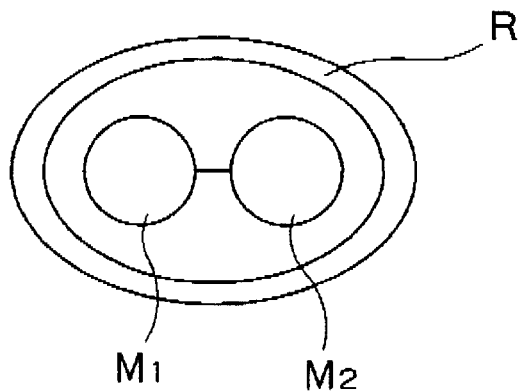
Figure 5A:
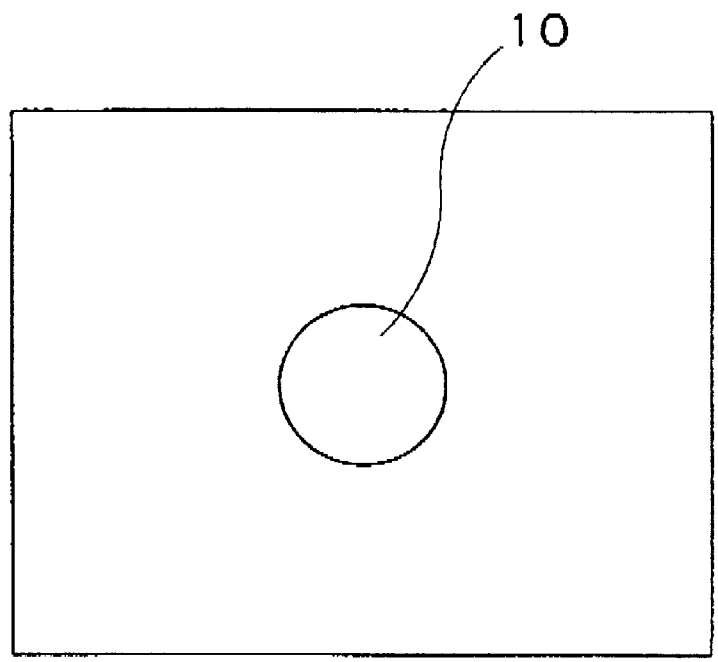
FIGS. 5A and 5B show conceptual views of the basic structure of a prior-art surface-emitting element, where
Figure 5B:
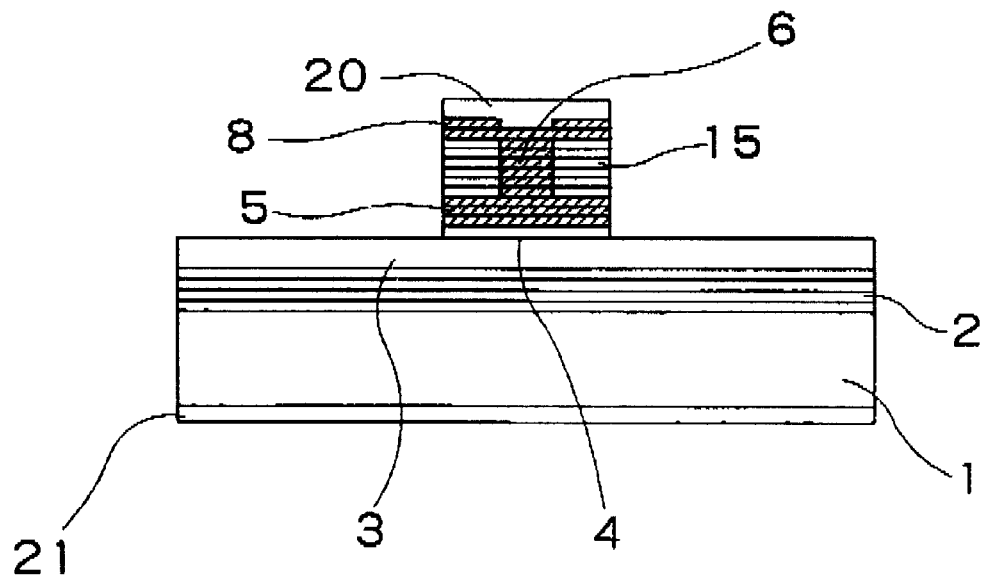

Conceptual views of various other examples of the planar relationship between the "medium", which is the mesa M, and the "waveguide," which is the ring laser R of the present invention are shown in FIGS. 4A through 4C. In other words, In the example shown in FIG. 4A, both the mesa M and the ring laser R are formed to have a square shape. In the invention should be understood to include all possible embodiments and modification to the shown embodiments which can be embodied without departing from the principle of the invention as set forth in the appended claims.

The entire disclosure of Japanese Patent Application No.H11-262680 filed on Sep. 16, 1999 including specification, claims, drawings and summary is incorporated herein by reference in its entirety.

What is claimed is:

1. An optical amplification and/or light emitting element comprising:
   a medium including an active layer, said medium being capable of light emission in a direction substantially vertical to a predetermined plane by optical pumping;
   a pair of reflective mirrors that are substantially parallel to said predetermined plane surface and sandwiching said medium;
   a waveguide provided so as to surround said medium on said predetermined plane surface, said waveguide including a diffraction grating of a second order or more for extracting at least part of a light that is guided by said waveguide and emitting the same towards said medium; and
   a gain mechanism disposed on said predetermined plane surface, on an outer side of said waveguide as seen from said medium.

2. The optical amplification and/or light emitting element as defined in claim 1, wherein said waveguide includes a p-type semiconductor layer, an active layer and an n-type semiconductor layer stacked in a direction vertical to said predetermined plane surface.

3. The optical amplification and/or light emitting element as defined in claim 1, wherein said gain mechanism includes a p-type semiconductor layer, an active layer and an n-type semiconductor layer stacked in a direction vertical to said predetermined plane surface.

4. The optical amplification and/or light emitting element as defined in claim 1, further comprising a reflective structure disposed on said predetermined plane surface, on an outer side of said gain mechanism as seen from said medium.

5. The optical amplification and/or light emitting element as defined in claim 1, wherein said waveguide and said gain mechanism are provided in a concentric configuration around said medium respectively.

6. The optical amplification and/or light emitting element as defined in claim 1, wherein said waveguide and said gain mechanism are provided in a polygonal configuration around said medium respectively.

7. An optical amplification and/or light emitting element comprising:
   a first medium provided on a predetermined plane surface and capable of at least light emission or amplification of the same by optical pumping;
   a second medium provided on said predetermined plane surface and capable of at least light emitter for amplification of the same by optical pumping; and
   a waveguide provided so as to surround said first and second media on said predetermined plane surface,
   wherein said waveguide includes a holographic element for extracting at least part of a light that is guided by said waveguide and emitting the same towards said first and second media.

8. The optical amplification and/or light emitting element as defined in claim 6, further comprising a gain mechanism disposed on said predetermined plane surface, on an outer side of said waveguide as seen from said first and second media.

* * * * *